US010862185B2

(12) United States Patent
Eilert

(10) Patent No.: US 10,862,185 B2
(45) Date of Patent: Dec. 8, 2020

(54) INTEGRATED CIRCUIT WITH CAPACITOR IN DIFFERENT LAYER THAN TRANSMISSION LINE

(71) Applicant: SEMICONDUCTOR COMPONENTS INDUSTRIES, LLC, Phoenix, AZ (US)

(72) Inventor: Kimberly Dawn Eilert, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 60 days.

(21) Appl. No.: 16/107,377

(22) Filed: Aug. 21, 2018

(65) Prior Publication Data

US 2019/0173148 A1 Jun. 6, 2019

Related U.S. Application Data

(60) Provisional application No. 62/593,725, filed on Dec. 1, 2017.

(51) Int. Cl.
*H01P 1/203* (2006.01)
*H01P 3/08* (2006.01)
(Continued)

(52) U.S. Cl.
CPC ............. *H01P 3/08* (2013.01); *H01L 23/528* (2013.01); *H01L 23/5222* (2013.01);
(Continued)

(58) Field of Classification Search
CPC .. H01P 1/203; H01P 1/20327; H01P 1/20336; H01P 1/20345; H01P 1/205
(Continued)

(56) References Cited

U.S. PATENT DOCUMENTS 4,638,271 A * 1/1987 Jecko ...................... H01P 1/203
333/205
5,343,176 A * 8/1994 Hasler ................. H01P 1/20336
333/204

(Continued)

FOREIGN PATENT DOCUMENTS

CA 2004184 A1 5/1990
EP 0373028 A1 6/1990
WO 2013141897 A1 9/2018

OTHER PUBLICATIONS

Xin Wang et al., "CMOS 170 GHz Combline Bandpass Filter," 2015 IEEE MTT-S International Conference on Microwaves for Intelligent Mobility.

*Primary Examiner* — Stephen E. Jones
(74) *Attorney, Agent, or Firm* — Brake Hughes Bellermann LLP

(57) ABSTRACT

An integrated circuit can include a first capacitor in a first end portion of the integrated circuit and including a first plate and a second plate, the first plate of the first capacitor being electrically coupled to ground and within a first metal layer of the integrated circuit, a first transmission line electrically coupled to the second plate of the first capacitor, the first transmission line being within a second metal layer of the integrated circuit, a second capacitor in a second end portion of the integrated circuit and including a first plate and a second plate, the first plate of the second capacitor being electrically coupled to ground and within the first metal layer of the integrated circuit, and a second transmission line electrically coupled to the second plate of the second capacitor, the second transmission line being in the second metal layer of the integrated circuit.

20 Claims, 7 Drawing Sheets

(51) Int. Cl.
*H01L 23/522* (2006.01)
*H01L 27/08* (2006.01)
*H01L 23/528* (2006.01)
*H05K 1/02* (2006.01)
*H01P 5/18* (2006.01)
*H01L 23/66* (2006.01)
*H01L 49/02* (2006.01)
*H01L 23/64* (2006.01)
*H01L 27/01* (2006.01)

(52) U.S. Cl.
CPC .......... *H01L 23/5223* (2013.01); *H01L 23/64* (2013.01); *H01L 23/66* (2013.01); *H01L 27/0805* (2013.01); *H01L 28/60* (2013.01); *H01P 1/203* (2013.01); *H01P 1/20345* (2013.01); *H01P 5/184* (2013.01); *H05K 1/0231* (2013.01); *H05K 1/0236* (2013.01); *H01L 27/016* (2013.01); *H01L 2223/6627* (2013.01)

(58) Field of Classification Search
USPC .......................................... 333/203, 204, 205
See application file for complete search history.

(56) References Cited

U.S. PATENT DOCUMENTS

| | | | |
|---|---|---|---|
| 6,323,745 B1* | 11/2001 | Toncich | H01P 1/20336 333/203 |
| 8,410,578 B2 | 4/2013 | Hose et al. | |
| 9,564,672 B2 | 2/2017 | Burke et al. | |
| 2001/0030588 A1* | 10/2001 | Son | H01P 1/20336 333/203 |
| 2003/0048156 A1* | 3/2003 | Uriu | H03H 7/1775 333/175 |
| 2005/0200436 A1* | 9/2005 | Lee | H01P 1/20345 333/204 |

* cited by examiner

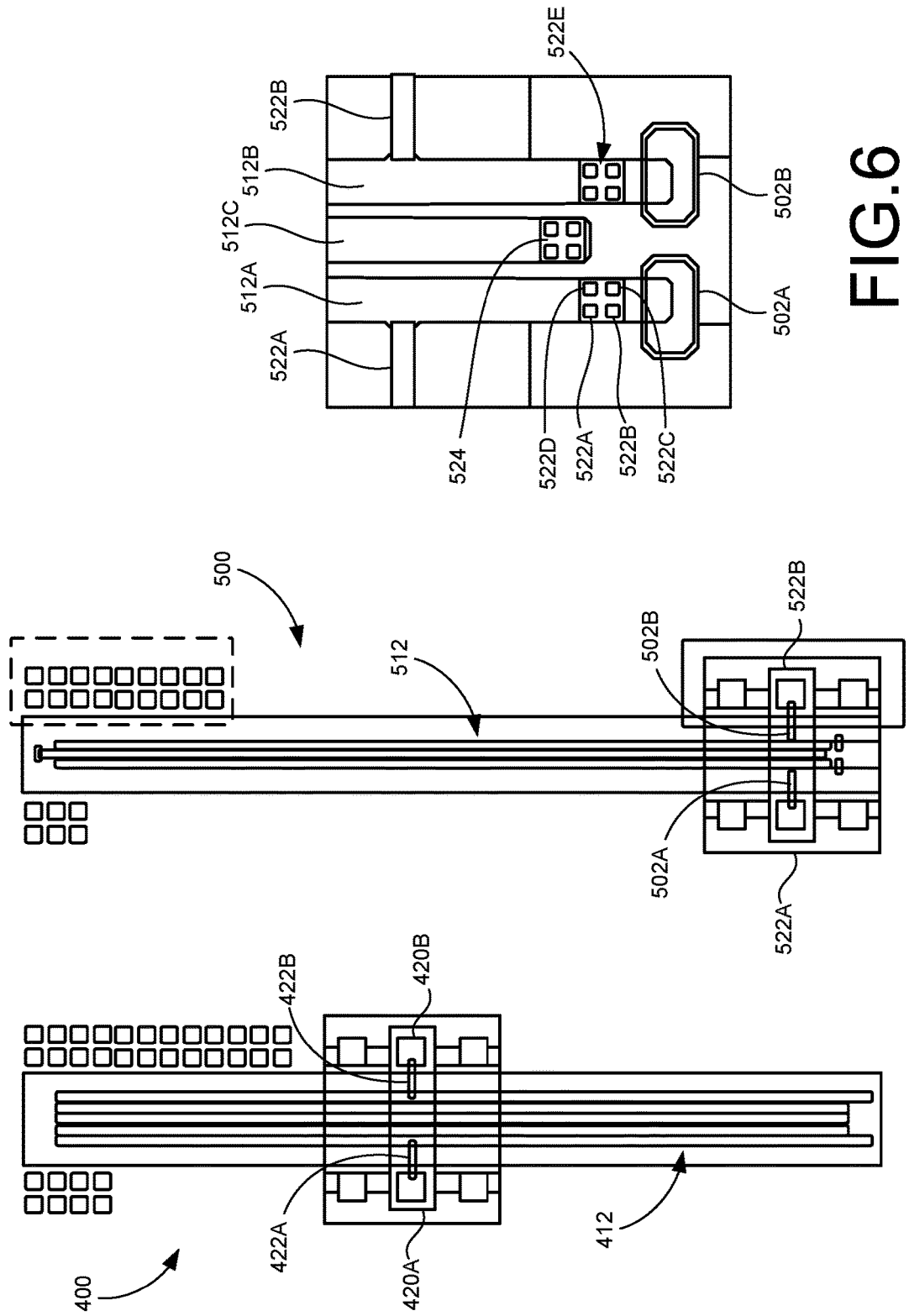

INTEGRATED CIRCUIT WITH CAPACITOR IN DIFFERENT LAYER THAN TRANSMISSION LINE

CROSS-REFERENCE TO RELATED APPLICATION

This application claims priority to U.S. Provisional Application No. 62/593,725, filed on Dec. 1, 2017, entitled, "COMBLINE FILTER IMPLEMENTATION ON SEMICONDUCTOR WAFERS," the disclosure of which is hereby incorporated by reference.

TECHNICAL FIELD

This description relates to integrated circuits including transmission lines.

BACKGROUND

Current wireless standards have created a need for filters that can operate at high frequencies, such as microwave frequencies. Filters with long transmission lines can result in unacceptably high line losses.

SUMMARY

According to an example, an integrated circuit can include a first capacitor disposed in a first end portion of the integrated circuit and including a first plate and a second plate, the first plate of the first capacitor being electrically coupled to ground and disposed within a first metal layer of the integrated circuit, a first transmission line electrically coupled to the second plate of the first capacitor, the first transmission line being disposed within a second metal layer of the integrated circuit, a second capacitor disposed in a second end portion of the integrated circuit and including a first plate and a second plate, the first plate of the second capacitor being electrically coupled to ground and disposed within the first metal layer of the integrated circuit, and a second transmission line electrically coupled to the second plate of the second capacitor, the second transmission line being disposed within the second metal layer of the integrated circuit.

According to an example, a wafer can comprise multiple integrated circuits. Each of the integrated circuits can include a first capacitor disposed within a first end portion of the integrated circuit and including a first plate and a second plate, the first plate of the first capacitor being electrically coupled to ground and disposed within a first metal layer of the integrated circuit, a first transmission line electrically coupled to the second plate of the first capacitor, the first transmission line being disposed within a second metal layer of the integrated circuit, a second capacitor disposed in a second end portion of the integrated circuit and including a first plate and a second plate, the first plate of the second capacitor being electrically coupled to ground and disposed within the first metal layer of the integrated circuit, and a second transmission line electrically coupled to the second plate of the second capacitor, the first transmission line being disposed within the second metal layer of the integrated circuit.

According to an example, an integrated circuit can include a first combline filter component, and a second combline filter component. The first combline filter component can include a first capacitor disposed in a first end portion of the integrated circuit and including a first plate and a second plate, the first plate of the first capacitor being electrically coupled to ground and disposed within a first layer of the integrated circuit, a first electrically conductive extension portion extending from the second plate of the first capacitor, a first via extending from the first electrically conductive extension portion to a second layer of the integrated circuit, and a first transmission line electrically coupled to the first via, the first transmission line being disposed in the second layer of the integrated circuit, extending to a second end portion of the integrated circuit, and being coupled to ground. The second combline filter component can include a second capacitor disposed in the second end portion of the integrated circuit and including a first plate and a second plate, the first plate of the second capacitor being electrically coupled to ground and disposed within the first layer of the integrated circuit, a second electrically conductive extension portion extending from the second plate of the second capacitor, a second via extending from the second electrically conductive extension portion to the second layer of the integrated circuit, and a second transmission line electrically coupled to the second via, the second transmission line being disposed in the second layer of the integrated circuit, extending to the first end portion of the integrated circuit, and being coupled to ground.

The details of one or more implementations are set forth in the accompanying drawings and the description below. Other features will be apparent from the description and drawings, and from the claims.

BRIEF DESCRIPTION OF THE DRAWINGS

FIG. 4 is a top view of a combline filter with five transmission lines according to an example implementation.

FIG. 5 is a top view of a combline filter with three transmission lines according to an example implementation.

FIG. 6 is a top view of a portion of the combline filter of FIG. 5 according to an example implementation.

DETAILED DESCRIPTION

Combline filters, which can include a transmission line electrically coupled to a capacitor, can reduce the total length required for a filter that passes a specific frequency range. Including the capacitor and transmission line on different layers of an integrated circuit can enable a combline filter to be implemented on a substrate of the integrated circuit and reduce line losses.

Figure 1:
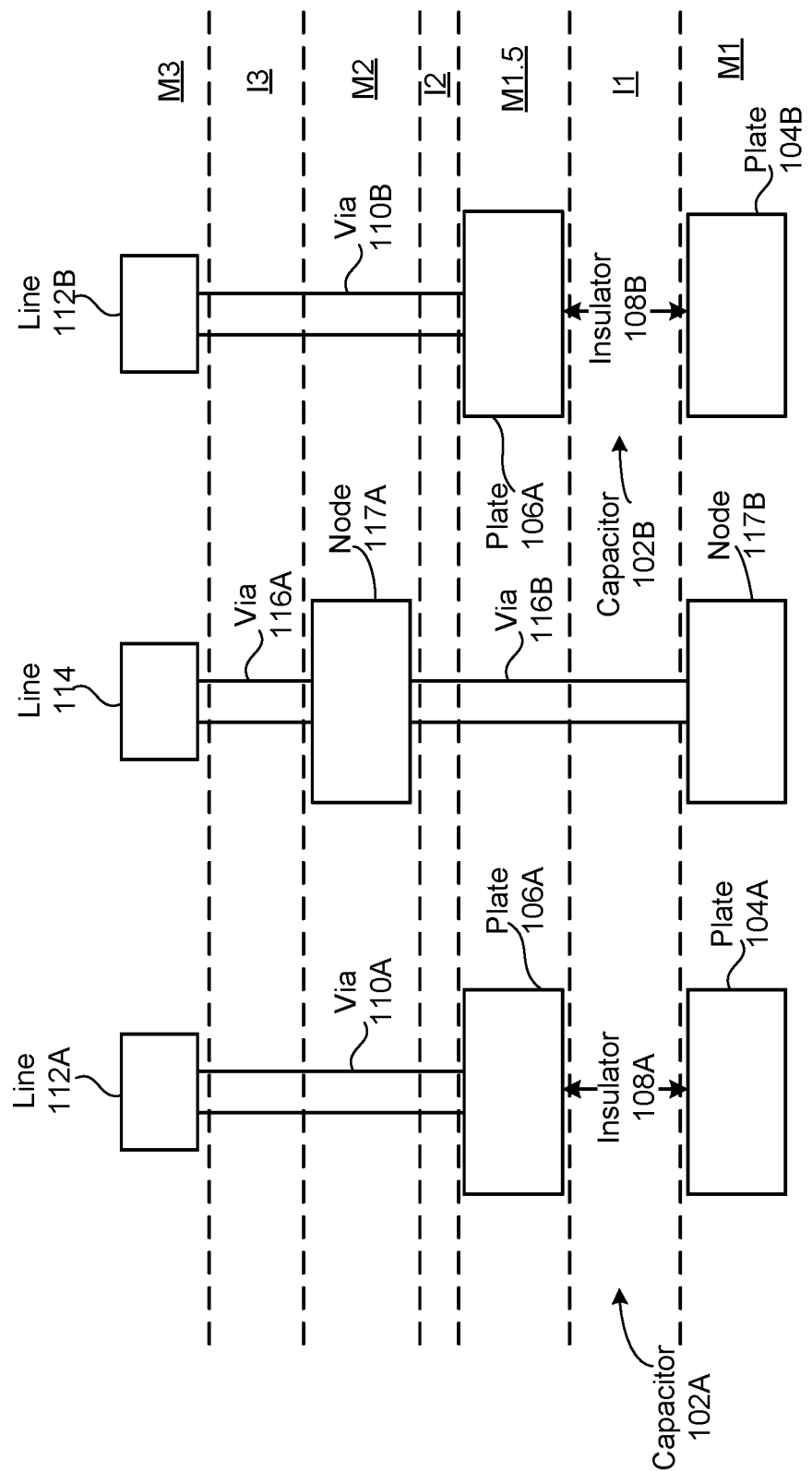
FIG. 1 is a front cross-sectional view of an integrated circuit according to an example implementation.

FIG. 1 is a front cross-sectional view of an integrated circuit 100 according to an example implementation. This view shows portions of three combline filter components. The concepts described in connection with this figure can be applied to any of the implementations described herein.

A first combline filter component can include a first capacitor 102A, which includes a first plate 104A disposed in a first metal layer labeled M1, a second plate 106A disposed in an intermediary metal layer M1.5, and an insulator 108A and/or insulator material disposed between the first plate 104A and the second plate 106A, a via 110A electrically coupled to the second plate 106A of the first capacitor 102A, and a first transmission line 112A electrically coupled to the via 110A. The first plate 104A of the first capacitor 102A can be coupled to ground within the first metal layer M1. The second plate 106A can extend into two metal layers, such as metal layers M1, M1.5. The first transmission line 112A can be disposed within a second metal layer, labeled M3. The plates 104A, 104B can be made of metal. Each of the metal layers M1, M1.5, M2, M3 can include electrical and/or electronic devices in addition to those shown and described herein. The metal layers M1, M1.5 M2, M3 can include silicon substrate enclosing and/or supporting the electrical and/or electronic devices. Insulator layers I1, I2, I3 can be interposed between the metal layers M1, M1.5, M2, M3. While four metal layers M1, M1.5, M2, M3 are shown in FIG. 1, the integrated circuit 100 can include any number of metal layers. The insulator 108A can be made of silicon nitride (SiN). The vias 110A, 110B, 116A, 116B can be shorter than shown in FIG. 1. The first combline filter component can also include components shown with respect to a second combline filter component, described below.

The second combline filter component can include a second transmission line 114 corresponding to the first transmission line 112A, and a via 116A, 116B electrically coupled to the transmission line 114. The via 116A, 116B can extend from the second transmission line 114 within the second metal layer M3 to the first metal layer M1, and can couple the second transmission line 114 to a ground node 117B disposed within the first metal layer M1. The vias 116A, 116B can be coupled to each other by a node 117A disposed within the metal layer M2. The second combline filter component can also include components shown and described above with respect to the first combline filter component.

A third combline filter component can include same components as the first and second combline filter components. In the example shown in FIG. 1, the third combline filter component can include a third capacitor 102B corresponding to the first capacitor 102A and including a first plate 104B, a second plate 106B, and an insulator 108B disposed between the first plate 104B and second plate 106B. The third combline filter component can include a via 110B corresponding to the via 110A which is coupled to the second plate 106B and extends to the second layer M3, and a transmission line 112B corresponding to the transmission line 112A and coupled to the via 110B. The layers M1, M1.5, M2, M3 of the integrated circuit can be portions of a wafer substrate made of an insulative material, such as high-resistivity silicon. The integrated circuit 100 can include dielectric layers I1, I2, I3 (e.g., oxide layers, high-k dielectric layers) between layers M1, M1.5, M2, M3, which dielectric layers I1, I2, I3 can include silicon dioxide ($SiO_2$). In some implementations, different metal layers can be used (e.g., M2, M2.5, M3, M4).

In some implementations, the widths of the transmission lines (112A, 112B, 112C) can be the same. In some implementations, the cross-sectional areas of the transmission lines (112A, 112B, 112C) can be the same.

Figure 2:
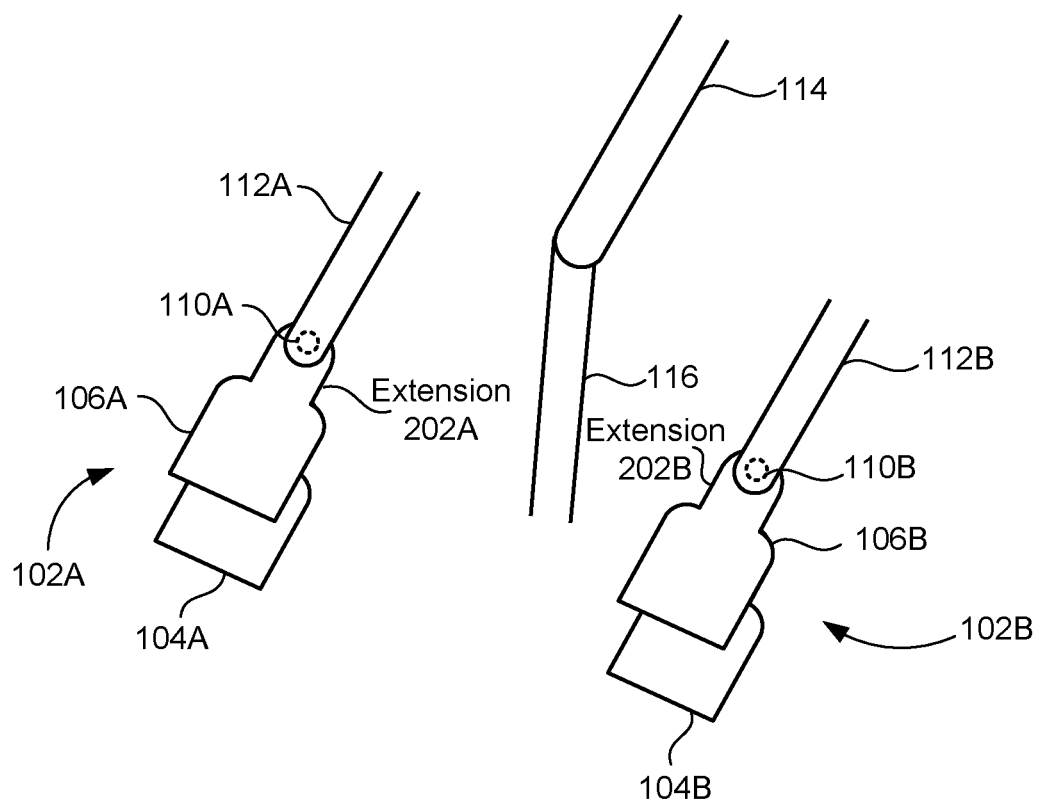
FIG. 2 is a perspective view of the integrated circuit according to an example implementation.

FIG. 2 is a perspective view of the integrated circuit 100 according to an example implementation. As shown in this example, the second plates 106A, 106B of the first capacitors 102A, 102B are disposed above their respective first plates 104A, 104B. Extension portions 202A, 202B, which can be shaped as panhandles and/or can be electrically conductive extension portions, extend from each of the second plates 106A, 106B. The extension portions 202A, 202B extend from the second plates 106A, 106B in a direction parallel to the second plates 106A, 106B from which the extension portions 202A, 202B extend. The extension portions 202A, 202B can be narrower, and/or have a smaller area when viewed from a top and/or bottom perspective (such as the top perspective shown in FIG. 3), than the second plates 106A, 106B from which the extension portions 202A, 202B extend. The extension portions 202A, 202B can be electrically coupled to the vias 110A, 110B. The vias 110A, 110B can electrically couple the extension portions 202A, 202B and/or second plates 106A, 106B to the transmission lines 112A, 112B.

The via 116 (representing the two vias 116A, 116B shown in FIG. 1) can be electrically coupled to the second transmission line 114. The via 116A, 116B can electrically couple the second transmission line 114 to ground within the first layer M1 (not labeled in FIG. 2).

Figure 3:
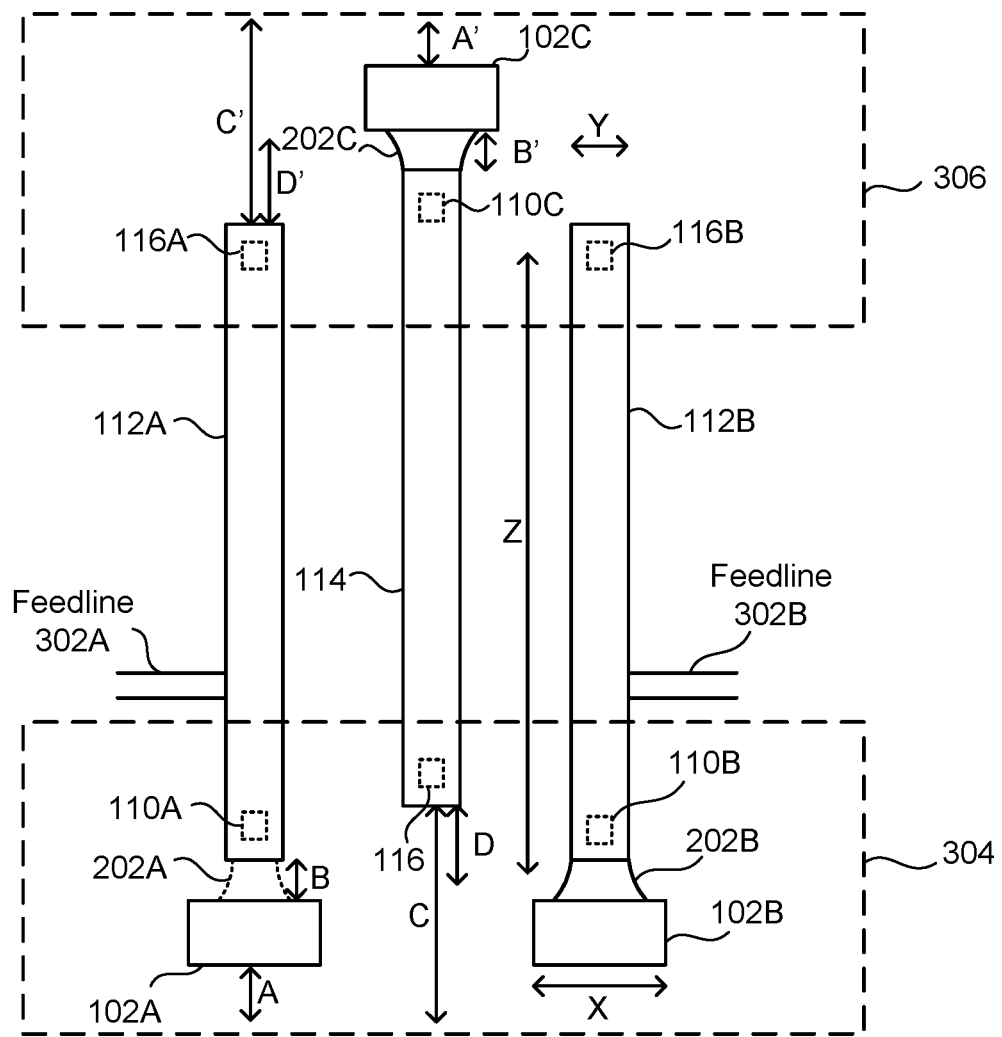
FIG. 3 is a top plan view of the integrated circuit according to an example implementation.

FIG. 3 is a top plan view of the integrated circuit 100 according to an example implementation. The concepts described in connection with this figure can be applied to any of the implementations described herein.

In some examples, the first and third capacitors 102A, 102B, the extension portions 202A, 202B electrically coupled to the first and third capacitors 102A, 102B, the vias 110A, 110B that electrically couple the first and third transmission lines 112A, 112B to the first and third capacitors 102A, 102B, and the via 116 that electrically couples the second transmission line 114 to ground, can be included in a first end portion 304 of the integrated circuit. In some examples, the second capacitor 102C, the second extension portion 202C extending from and/or electrically coupled to the second capacitor 102C, the second via 110C that electrically couples the second extension portion 202C and/or second capacitor 102C to the second transmission line 114, and the first and third vias 116A, 116B that electrically couple the first and third transmission lines 112A, 112B to ground, can be included in a second end portion 306 of the integrated circuit 100. The first end portion 304 can be disposed on an opposite end of the integrated circuit 100 from the second end portion 306. Lengths Z of the transmission lines 112A, 112B, 114, from the extension portions 202A, 202B, 202C and/or capacitors 102A, 102B, 102C, to the vias 110A, 110B, 110C, can be less than three millimeters (3 mm), such as two millimeters (2 mm). The capacitances of the capacitors 102A, 102B, 102C can be less than six picofarads (6 pF), such as five picofarads (5 pF) or less. A distance A of the capacitor 102A from the end of the integrated circuit 100 can be less than a distance C of an adjacent transmission line 114 from the end of the integrated circuit 100. A distance D of the transmission line 114 to the beginning of the adjacent capacitor 102A, 102B and/or extension portion 202A, 202B can be greater than a length B of the extension portion 202A, 202B. A width X of the capacitors 102A, 102B, 102C can be greater than a width Y of the transmission lines 112A, 112B, 114.

The lengths Z of the transmission lines 112A, 112B, 114 can be the same. In some implementations, the lengths of two or more of the transmission lines 112A, 112B, 114 can be the different. The widths X of the capacitors 102B, 102B, 102C can be the same. In some implementations, the widths of two or more of the capacitors 102B, 102B, 102C can be the different. The lengths Z of the transmission lines (112A, 112B, 114) can be significantly larger (e.g., greater than 20 times) than the widths of the transmission lines and/or the widths X of the capacitors 102A, 102B, 102C.

As shown in FIG. 3, the capacitors 102A, 102B are on an end opposite that of capacitor 102C. The combline filter components can have a directionality that extends from the capacitors (102A, 102B, 102C) down the transmission lines (112A, 112B, 114). With such directionality the combline filter components can be interleaving components. In some implementations, the outer combline filters components can by symmetrically oriented about the central combline filter component. In a device including an even number of combline filter components, the combline filter components can be interleaved.

The integrated circuit 100 can include feedlines 302A, 302B. The feedlines 302A, 302B can transmit signals from the filter, which can include the transmission lines 112A, 112B, to one or more signal processors. The signals transmitted and/or propagated by the feedlines can be electromagnetic waves. The filter can pass electromagnetic waves at specified frequency bands, which can be within the microwave frequency range, such as between one Gigahertz and ten Gigahertz (between 1 GHz and 10 GHz) or between ten Gigahertz and thirty Gigahertz (between 10 GHz and 30 GHz). The filter can filter electromagnetic waves outside the specified frequency bands. The components of the filter can be electrically isolated from each other. While three filter components are shown in FIGS. 1, 2, 3, 5, and 6, and five filter components are shown in FIG. 4, the integrated circuit can include any even or odd number of filter components. The filter components can be arranged in a staggered format, with adjacent filter components having their respective capacitors 102A, 102B, 102C disposed in in opposite end portions 304, 306 from each other.

FIG. 4 is a top view of a combline filter 400 with five transmission lines 412 according to an example implementation. The combline filter 400 can be included in an integrated circuit, such as the integrated circuit 100 described above. The transmission lines 412 can have similar features and/or functionality as the transmission lines 112A, 112B, 114 described above. The combline filter 400 can include feedlines 422A, 422B with similar features and/or functionalities as the feedlines 302A, 302B described above. The combline filter 400 can include signal processors 420A, 420B coupled to the feedlines 422A, 422B. The signal processors 420A, 420B can process the electromagnetic signals filtered by the combline filter 400.

FIG. 5 is a top view of a combline filter 500 with three transmission lines according to an example implementation. The combline filter 500 can be included in an integrated circuit, such as the integrated circuit 100 described above. The transmission lines 512 can have similar features and/or functionality as the transmission lines 112A, 112B, 114 described above. The combline filter 500 can include feedlines 502A, 502B with similar features and/or functionalities as the feedlines 302A, 302B described above. The combline filter 500 can include signal processors 522A, 522B coupled to the feedlines 502A, 502B. The signal processors 522A, 522B can process the electromagnetic signals filtered by the combline filter 500.

FIG. 6 is a top view of a portion of the combline filter 500 of FIG. 5 according to an example implementation. In this example, capacitors 502A, 502B, which can correspond to and/or have similar features and/or functionalities as the capacitors 102A, 102B, can be wider than transmission lines 512A, 512B, which can have similar features and/or functionalities as the transmission lines 112A, 112B.

In this example, each transmission line 512A, 512B is coupled to four vias 522A, 522B, 522C, 522D (vias 522E and 524 each represent four vias). The groups of four vias 522A, 522B, 522C, 522D, 522E, 524 can correspond to the vias 110A, 110B, 116A, 116B described above.

Figure 7:
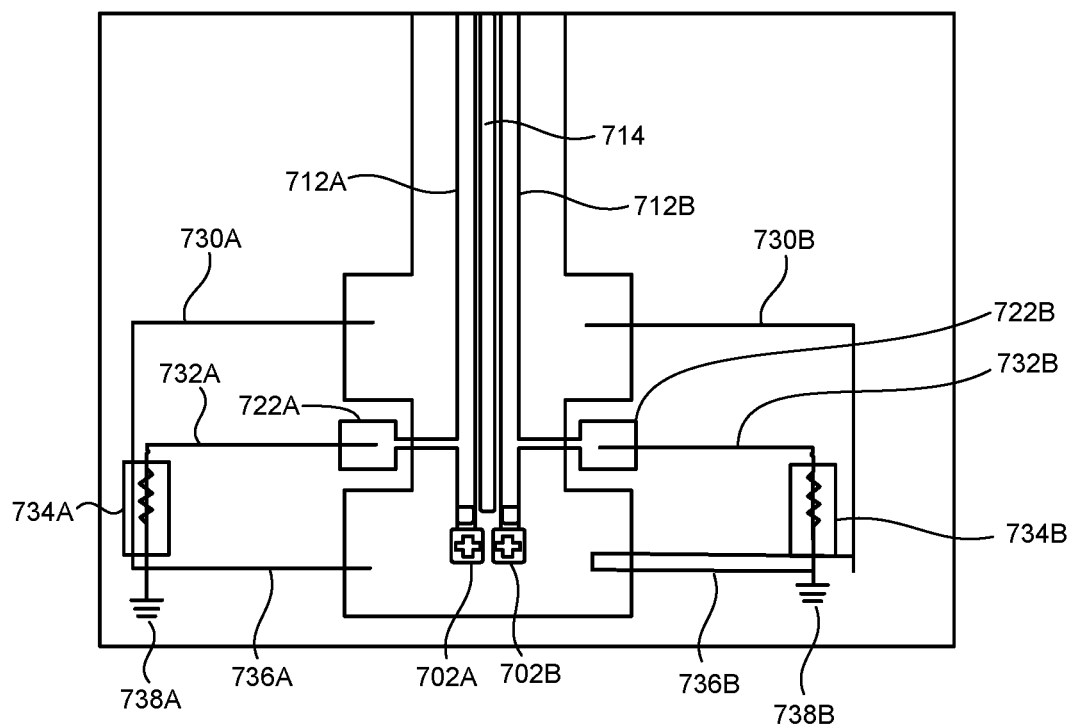
FIG. 7 is a top view of a combline filter according to an example implementation.

FIG. 7 is a top view of a combline filter according to an example implementation. The frequency responses shown in FIGS. 8A and 8B are based on input to the combline filter of FIG. 7.

The combline filter can include transmission lines 712A, 712B, 714 corresponding to the transmission lines 112A, 112B, 114 described above, capacitors 702A, 702B corresponding to the capacitors 102A, 102B described above, feedlines 742A, 742B corresponding to the feedlines 302A, 302B described above, and signal processors 722A, 722B corresponding to the signal processors 420A, 420B, 522A, 522B described above. The combline filter can include nodes 736A, 736B coupled to ground 738A, 738B and to a load 734A, 734B, nodes 732A, 732B coupled to the signal processors 722A, 722B and the load 734A, 734B of 50 Ohms, and nodes 730A, 730B coupled to the loads 734A, 734B. The tested signal can have a center frequency of 7 GHz.

Figure 8A:
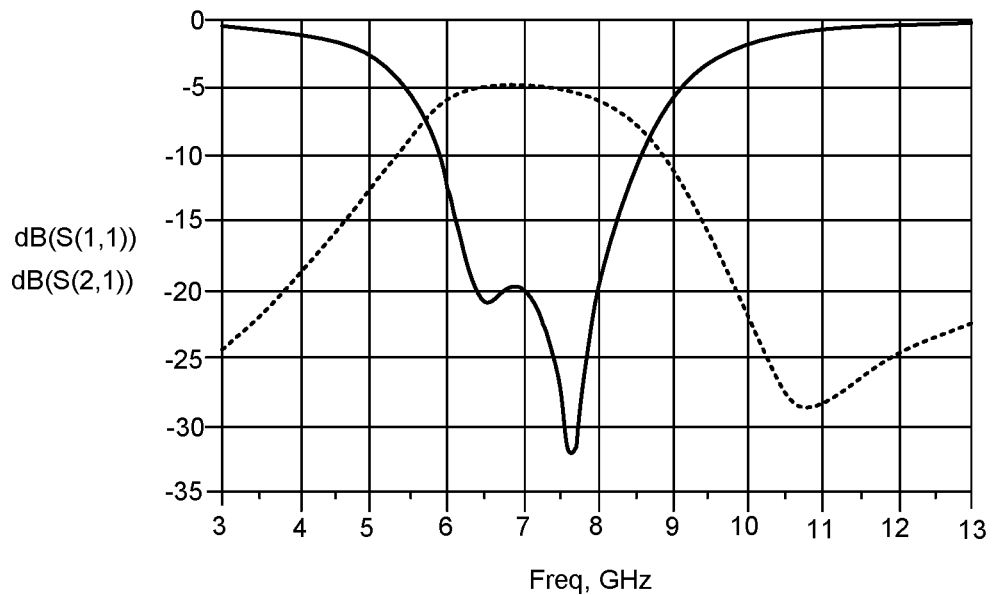
FIG. 8A is a graph showing a frequency response of a combline filter according to an example implementation.

FIG. 8A is a graph showing a frequency response of a combline response according to an example implementation. The loss is minimized, and the passed signals maximized, at and around the center frequency of 7 GHz.

Figure 8B:
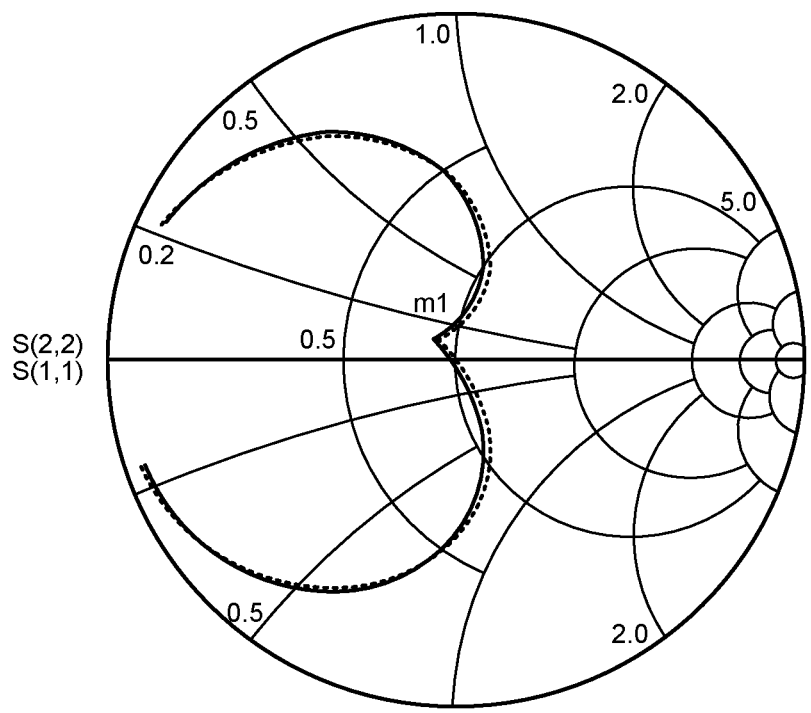
FIG. 8B is another graph showing a frequency response of a combline filter according to an example implementation.

FIG. 8B is another graph showing a frequency response of a combline filter according to an example implementation.

Figure 9:
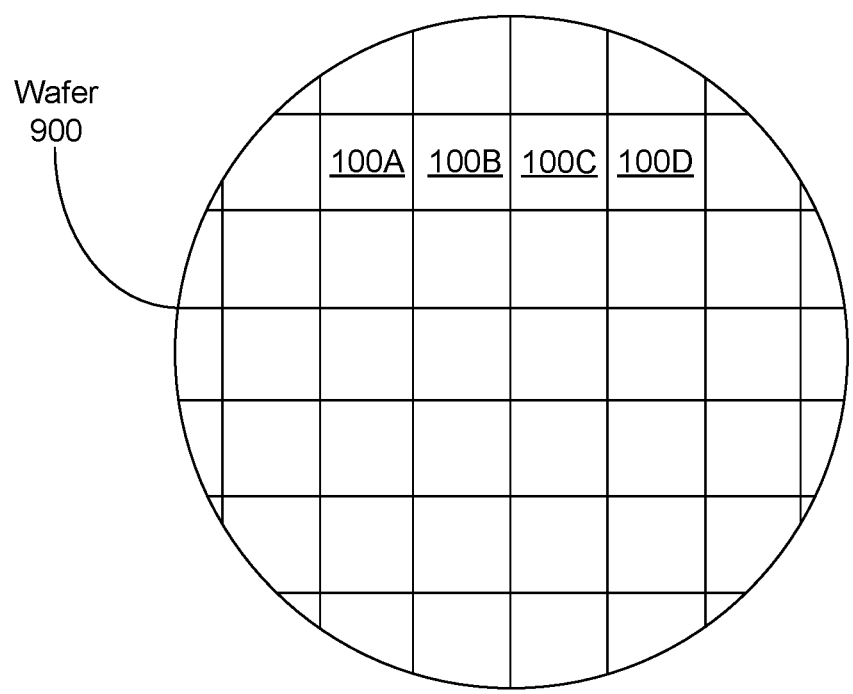
FIG. 9 is a top view of a wafer including multiple integrated circuits according to an example implementation.

FIG. 9 is a top view of a wafer 900 including multiple integrated circuits 100A, 100B, 100C, 100D according to an example implementation. The integrated circuits 100A, 100B, 100C, 100D can include any combination of the integrated circuit 100 described above. While four integrated circuits 100A, 100B, 100C, 100D are shown in FIG. 9, the wafer 900 can include any number of integrated circuits 100A, 100B, 100C, 100D. The wafer 900 can be manufactured according to silicon Very Large Scale Integrated (VLSI) technology.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An integrated circuit comprising:
   a first capacitor disposed in a first end portion of the integrated circuit and including a first plate and a second plate, the first plate of the first capacitor being disposed within a first metal layer of the integrated circuit, the second plate of the first capacitor being disposed within a second metal layer of the integrated circuit;
   a first transmission line electrically coupled to the second plate of the first capacitor, the first transmission line being disposed within a third metal layer of the integrated circuit, the second metal layer being disposed between the first metal layer and the third metal layer;
   an electrically conductive extension portion extending from the second plate of the first capacitor, the electrically conductive extension portion being narrower than the second plate of the first capacitor and broader than the first transmission line;
   a via extending from the electrically conductive extension portion to the first transmission line;
   a second capacitor disposed in a second end portion of the integrated circuit and including a first plate and a second plate, the first plate of the second capacitor being disposed within the first metal layer, the second plate of the first capacitor being disposed within the second metal layer; and
   a second transmission line electrically coupled to the second plate of the second capacitor, the second transmission line being disposed within the third metal layer of the integrated circuit.

2. The integrated circuit of claim 1, wherein the first transmission line extends from the first end portion of the integrated circuit to the second end portion of the integrated circuit.

3. The integrated circuit of claim 1, wherein the first transmission line is electrically coupled to ground.

4. The integrated circuit of claim 1, wherein the first transmission line is electrically coupled to ground by a via extending from an end portion of the transmission line to the first metal layer of the integrated circuit.

5. The integrated circuit of claim 1, wherein the first transmission line is parallel to the second transmission line.

6. The integrated circuit of claim 1, further comprising a feedline coupled to the first transmission line, the feedline propagating electromagnetic waves from the first transmission line to a signal processor.

7. The integrated circuit of claim 1, wherein the first capacitor has a capacitance of less than six picofarads.

8. The integrated circuit of claim 1, further comprising an insulator material disposed between the first plate of the first capacitor and the second plate of the first capacitor.

9. The integrated circuit of claim 1, wherein the second plate of the first capacitor extends into two layers of the integrated circuit, each of the two layers including electrical devices of the integrated circuit.

10. The integrated circuit of claim 1, wherein the first plate of the first capacitor and the second plate of the first capacitor are parallel to the first transmission line.

11. The integrated circuit of claim 1, wherein a combination of the first capacitor and the first transmission line passes electromagnetic waves at microwave frequencies.

12. The integrated circuit of claim 1, wherein a combination of the first capacitor and the first transmission line filters electromagnetic waves outside of microwave frequencies.

13. The integrated circuit of claim 1, wherein the first metal layer of the integrated circuit comprises a silicon substrate.

14. The integrated circuit of claim 1, wherein the first plate of the first capacitor is electrically coupled to ground, the ground being closer to the first metal layer than to the second metal layer.

15. The integrated circuit of claim 1, wherein the electrically conductive extension portion extends from the second plate of the first capacitor in a direction parallel to the first transmission line.

16. A wafer comprising multiple integrated circuits, each of the integrated circuits comprising:
   a first capacitor disposed in a first end portion of the integrated circuit and including a first plate and a second plate, the first plate of the first capacitor being electrically coupled to ground and disposed within a first metal layer of the integrated circuit, the second plate of the first capacitor being disposed within a second metal layer of the integrated circuit;
   a first transmission line electrically coupled to the second plate of the first capacitor, the first transmission line being disposed within a third metal layer of the integrated circuit, the second metal layer being disposed between the first metal layer and the third metal layer;
   an electrically conductive extension portion extending from the second plate of the first capacitor, the electrically conductive extension portion being narrower than the second plate of the first capacitor and broader than the first transmission line;
   a via extending from the electrically conductive extension portion to the first transmission line;

a second capacitor disposed in a second end portion of the integrated circuit and including a first plate and a second plate, the first plate of the second capacitor being disposed within the first metal layer, the second plate of the first capacitor being disposed within the second metal layer; and a second transmission line electrically coupled to the second plate of the second capacitor, the second transmission line being disposed within the third metal layer.

17. An integrated circuit comprising:
a first filter component, the first combline filter component comprising:
  a first capacitor disposed in a first end portion of the integrated circuit and including a first plate and a second plate, the first plate of the first capacitor being electrically coupled to ground and disposed within a first layer of the integrated circuit, the second plate of the first capacitor being disposed within a second layer of the integrated circuit;
  a first electrically conductive extension portion extending from the second plate of the first capacitor, the first electrically conductive extension portion being narrower than the second plate of the first capacitor;
  a first via extending from the first electrically conductive extension portion to a third layer of the integrated circuit, the second layer being disposed between the first layer and the third layer; and
  a first transmission line electrically coupled to the first via, the first transmission line being disposed in the third layer, extending to a second end portion of the integrated circuit, and being coupled to ground, the first transmission line being narrower than the first electrically conductive extension portion; and
a second combline filter component, the second combline filter component comprising:
  a second capacitor disposed in the second end portion of the integrated circuit and including a first plate and a second plate, the first plate of the second capacitor being disposed within the first layer, the second plate of the first capacitor being disposed within the second layer;
  a second electrically conductive extension portion extending from the second plate of the second capacitor, the second electrically conductive extension portion being narrower than the second plate of the second capacitor;
  a second via extending from the second electrically conductive extension portion to the third layer; and
  a second transmission line electrically coupled to the second via, the second transmission line being disposed in the third layer and extending to the first end portion of the integrated circuit.

18. The integrated circuit of claim 17, further comprising a third combline filter component, the third combline filter component comprising:
  a third capacitor disposed in the first end portion of the integrated circuit and including a first plate and a second plate, the first plate of the third capacitor being electrically coupled to ground and disposed within the first layer of the integrated circuit;
  a third electrically conductive extension portion extending from the second plate of the third capacitor;
  a third via extending from the third electrically conductive extension portion to the second layer of the integrated circuit; and
  a third transmission line electrically coupled to the third via, the third transmission line being disposed in the second layer of the integrated circuit, extending to the second end portion of the integrated circuit, and being coupled to ground,
  wherein the second combline filter is disposed between the first combline filter and the third combline filter.

19. The integrated circuit of claim 17, further comprising a feedline coupled to the first transmission line, the feedline propagating electromagnetic waves from the first transmission line to a signal processor.

20. The integrated circuit of claim 17, wherein the second plate of the first capacitor extends into two layers of the integrated circuit, each of the two layers including electrical devices of the integrated circuit.

* * * * *

UNITED STATES PATENT AND TRADEMARK OFFICE
CERTIFICATE OF CORRECTION

| | | |
|---|---|---|
| PATENT NO. | : 10,862,185 B2 | Page 1 of 1 |
| APPLICATION NO. | : 16/107377 | |
| DATED | : December 8, 2020 | |
| INVENTOR(S) | : Kimberly Dawn Eilert | |

It is certified that error appears in the above-identified patent and that said Letters Patent is hereby corrected as shown below:

In the Claims

In Column 9, Claim 17, Line 11, after "first", insert -- combline --.

Signed and Sealed this
Nineteenth Day of July, 2022

*Katherine Kelly Vidal*

Katherine Kelly Vidal
*Director of the United States Patent and Trademark Office*